United States Patent [19]
Ina

[11] Patent Number: 4,861,162
[45] Date of Patent: Aug. 29, 1989

[54] ALIGNMENT OF AN OBJECT

[76] Inventor: Hideki Ina, c/o Kosugi Jigyosho, Canon Kabushiki Kaisha, 53 Imaikamicho, Nakahara-ku, Kawasaki-shi, Kanagawa-ken, Japan

[21] Appl. No.: 273,707

[22] Filed: Nov. 15, 1988

Related U.S. Application Data

[60] Continuation of Ser. No. 152,926, Feb. 5, 1988, abandoned, which is a division of Ser. No. 862,621, May 13, 1986, abandoned.

[30] Foreign Application Priority Data

May 16, 1985 [JP] Japan ................................. 60-102727
Oct. 21, 1985 [JP] Japan ................................. 60-235924

[51] Int. Cl.$^4$ .............................................. G01B 11/00
[52] U.S. Cl. .................... 356/401; 356/400; 250/548; 250/557; 355/53; 355/77
[58] Field of Search ............... 356/375, 399, 400, 401; 355/53, 77; 250/491.1, 548, 557, 561; 378/34

[56] References Cited

U.S. PATENT DOCUMENTS 4,469,949 9/1984 Mori et al. ..................... 250/491.1
4,540,277 9/1985 Mayer et al. ......................... 355/53
4,642,468 2/1987 Tabata et al. ....................... 250/548

OTHER PUBLICATIONS

Fiore et al., *IBM Technical Disclosure Bulletin,* vol. 13, No. 12, May 1971, p. 3651.

Primary Examiner—F. L. Evans
Attorney, Agent, or Firm—Charles W. Chandler

[57] ABSTRACT

A method of sequentially positioning different regions of a semiconductor wafer, onto each of which regions an image is to be transferred at a transfer station, the method comprising the steps of: detecting, at a non-transfer station, positions of the different regions of the wafer with respect to a reference mark; detecting, at the transfer station, a position of the reference mark with respect to a standard mark; detecting positions of the different regions of the wafer with respect to the standard mark on the basis of the detection of the position of the reference mark with respect to the standard mark and the detection of the positions of the different regions of the water with respect to the reference mark; and moving the wafer so as to sequentially place the different regions thereof at the transfer station while controlling the movement of the wafer, for the sequential placing, in accordance with the detection of the positions of the different regions of the wafer with respect to the standard mark, whereby the different regions of the wafer are sequentially and accurately positioned with respect to the standard mark.

10 Claims, 5 Drawing Sheets

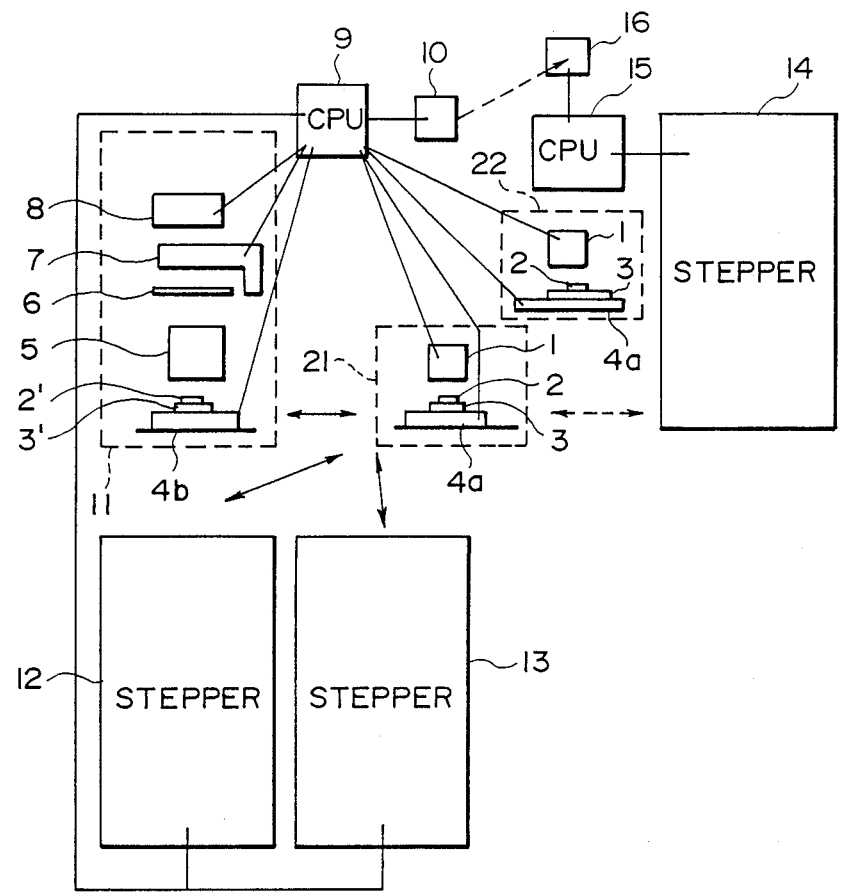
F I G. 1
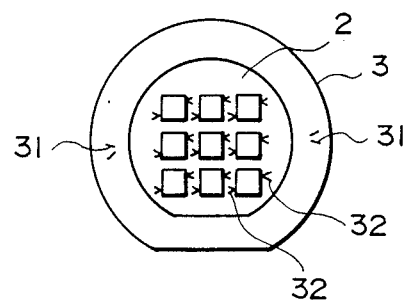
F I G. 2

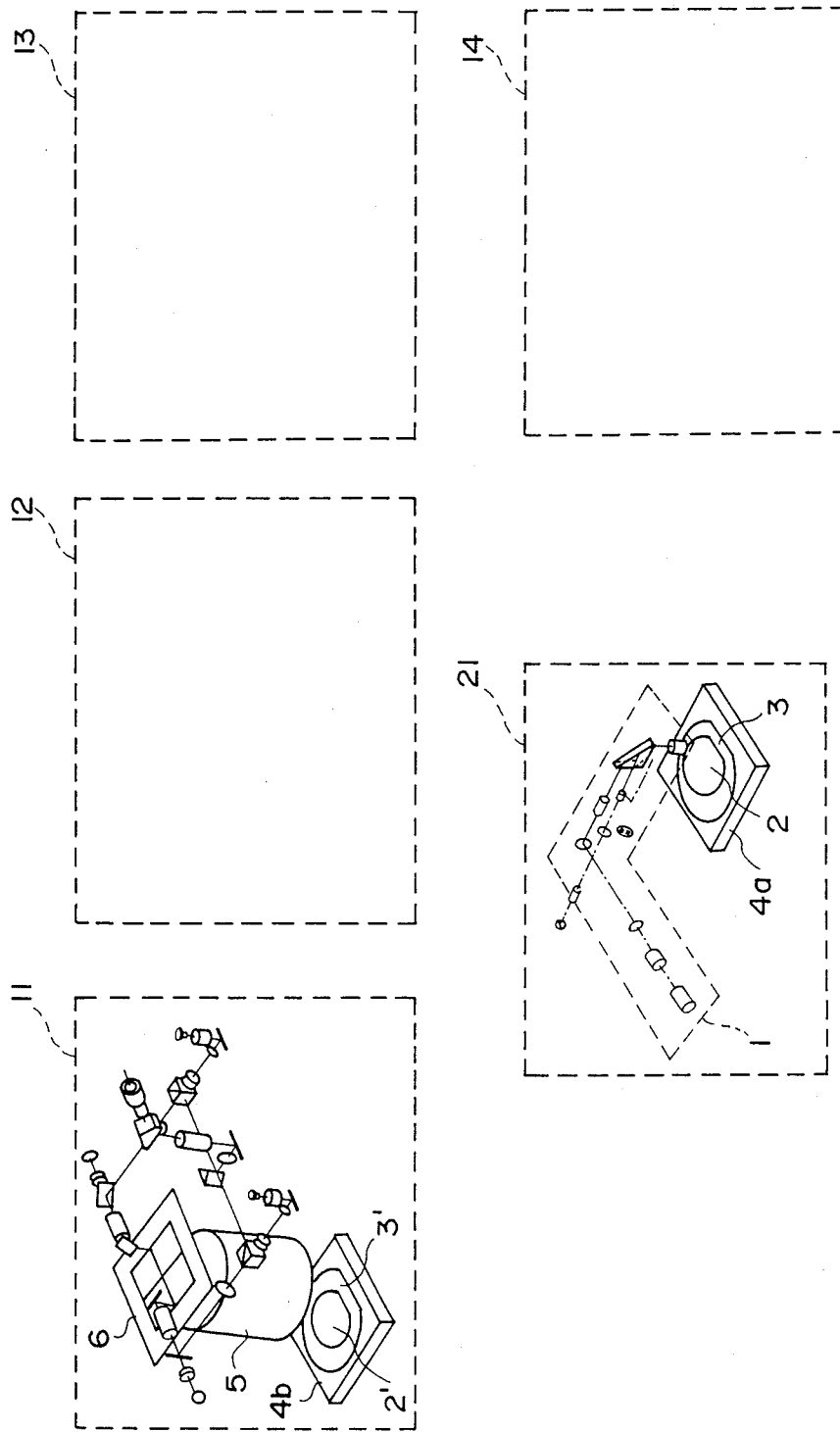

ALIGNMENT OF AN OBJECT

This application is a continuation of application Ser. No. 152,926 filed Feb. 5, 1988, now abandoned, which was a division of application Ser. No. 862,621, filed May 13, 1986, now abandoned.

FIELD OF THE INVENTION AND RELATED ART

This invention relates to improvements in alignment of an object such as a semiconductor wafer. More particularly, the invention is suitably applicable to manufacture of semiconductor devices such as integrated circuits by use of, e.g., step-and-repeat type reduction projection exposure apparatuses in which images of a pattern of a reticle are sequentially projected and transferred onto different regions of a semiconductor wafer by means of a projection optical system and at a reduced scale.

Various proposals have already been made as to alignment of an original such as a reticle and a plate-like member such as a semiconductor wafer, to be exposed, in the step-and-repeat type reduction projection exposure apparatus (hereinafter "stepper"). Of these proposals, an off-axis global alignment method (hereinafter "off-axis alignment method") and a TTL —Through The Lens—die-by-die alignment method (hereinafter "TTL alignment method") are prevalent The off-axis alignment method is characterized in that one or two alignment marks are formed on one wafer and the position of each alignment mark is detected by use of an optical system provided separately from a projection optical system of the exposure apapratus, and in that the wafer is repeatedly shifted each by a predetermined distance with the initial position being determined in reference to the mark position or positions. The "predetermined distance" corresponds to the relative position of two adjacent chips (semiconductor chips) on the wafer defined in respect to the alignment marks. The "predetermined distance" is preparatorily set in accordance with a pattern to be "printed" on the wafer. Usually, the regions of the wafer onto which images of the pattern of the reticle are to be respectively transferred are determined by setting, first, the relative position of a first shot area (first region) of the wafer with respect to the wafer alignment marks, and, second, by setting the relative position of a second shot area (second region) of the wafer with respect to the set position of the first shot area, and, third, by setting the relative position of a third shot area (third region) of the wafer with respect to the set position of the second shot area, and so on. In this manner, relative positions of the different regions of the wafer, to be exposed to the images of the pattern of the reticle, are determined. And, the distance between two adjacent shot areas is made constant So, such distance between two adjacent shot areas corresponds to the "predetermined distance". Accordingly, after detection of the positions of the wafer alignment marks, the positioning of the wafer in relation to each of the different regions of the wafer is controlled by detecting the amount of movement of the wafer.

According to the off-axis alignment method, as understood, only one alignment operation using one or two wafer alignment marks is necessary in relation to one wafer. Therefore, the time required for the alignment is reduced with the result that the exposure process of the wafer can be made at a higher speed. By this off-axis alignment method, however, high-accuracy alignment is not attainable. This is because the relative position of each chip on the wafer with respect to the wafer alignment marks or the distance between two adjacent chips on the wafer is liable to change by deformation or the like of the wafer due to high-temperature treatment and the like of the same during manufacturing processes of semiconductor devices. If there occurs an error in the relative position or the predetermined distance, such error can not be corrected by the off-axis alignment method.

As compared therewith, the TTL alignment method is characterized in that the alignment of the reticle and the wafer is effected by use of a projection optical system and for each of the different regions (shot areas) of the wafer. According to this TTL alignment method, the above-described problem peculiar to the off-axis alignment method can be obviated and, therefore, high-accuracy alignment is attainable. However, in the TTL alignment method, the alignment operation should be effected in respect to every one of the shot areas of the wafer, which necessarily results in prolongation of the time for alignment and thus deterioration of the throughput of the exposure apparatus.

Further, to achieve the TTL alignment of the reticle and the wafer by use of alignment marks, there is usually provided an optical arrangement in which a mark illuminating light source is disposed at a side of the reticle not facing the projection optical system and the wafer, such that, when a reticle alignment marks is illuminated by the light source, an image of the reticle alignment mark is projected by the projection optical system onto a surface of the wafer. And, imaging light reflected from the point of the wafer surface at which the reticle alignment mark is imaged is received by a photodetector as an optical signal after the imaging light from the wafer surface passes through the projection optical system and the reticle in the opposite direction. That is, in this arrangement, the light emitted from the mark illuminating light source has to pass through each of the reticle and the projection optical system twice. This reduces the intensity of the optical signal to be detected by the photodetector. Also, the formation of the image of the reticle alignment mark, as it is projected onto the wafer surface, is very unstable due to the phenomenon of diffraction or the surface condition of the wafer. Therefore, detection of the optical signal from the thus formed image of the reticle alignment mark as being projected onto the wafer surface inevitably leads to inclusion of a large amount of noise component. In order to detect a "clear" reticle alignment mark signal, it is necessary to detect the light directly reflected from the reticle alignment mark. And for this purpose, it is necessary to separate the light directly reflected by the reticle alignment mark from the light reflected from the wafer surface. For this reason, in some kinds of exposure apparatuses, an additional optical element such as a polarizing plate is included in the optical system so as to separate the two optical signals from each other. This results in complication of the optical arrangement and, in addition, high-precision is required in respect to the optical properties of the optical components such as the polarizing plate, polarizing beam splitter and the like.

SUMMARY OF THE INVENTION

It is accordingly a primary object of the present invention to provide improvements in alignment of an object such as a semiconductor wafer or the like, by which improvements high-accuracy and high-speed alignment of each of different regions of the object such as the wafer is attainable.

It is another object of the present invention to provide improvements in alignment of an object, the improvements being applicable to semiconductor device manufacturing apparatuses such as step-and-repeat type reduction projection exposure apparatuses (steppers) thereby to assure high-accuracy and high-speed alignment of each of different regions of a semiconductor wafer with an improved throughput of the exposure apparatus.

It is a further object of the present invention to provide improvement in alignment of an object, by which improvements a "clear" alignment mark signal can be detected stably with a simple and compact optical arrangement.

Briefly, according to one aspect of the present invention, there is provided a method of sequentially positioning different regions of a semiconductor wafer, onto each of which regions an image is to be transferred at a transfer station, said method comprising the steps of detecting, at a non-transfer station, positions of the different regions of the wafer with respect to a reference mark; detecting, at the transfer station, a position of the reference mark with respect to a standard mark; detecting positions of the different regions of the wafer with respect of the position of the reference mark with respect to the standard mark and the detection of the positions of the different regions of the wafer with respect to the reference mark; and moving the wafer so as to sequentially place the different regions thereof at the transfer station while controlling the movement of the wafer, for the sequential placing, in accordance with the detection of the positions of the different regions of the wafer with respect to the standard mark, whereby the different regions of the wafer are sequentially and accurately positioned with respect to the standard mark.

In accordance with another aspect of the present invention, there is provided a wafer holder for holding a semiconductor wafer and being usable with a position detecting device adapted to detect a relative position between said wafer holder and the wafer as it is held by said wafer holder, said wafer holder comprising: a base member having a surface including a carrying region on which the wafer is to be carried; means for applying an attracting force to the wafer by way of said base member so as to attract the wafer to the base member, such that the wafer is held on said carrying region; and a mark provided on said surface of said base member and at a portion thereof other than said carrying region, said mark having a position which is to be detected by the position detecting device when said wafer holder is used with the position detecting device.

According to a further aspect of the present invention, there is provided a position detecting device usable with a wafer holder for holding a semiconductor wafer and having a mark formed on a light-transmissible portion of the wafer holder, said device comprising: a carrying member for carrying thereon the wafer holder; beam generating means for generating a light beam; irradiating means for irradiating the mark formed on the light-transmissible portion of the wafer holder carried on said carrying member with the light beam generated by said beam generating means, said irradiating means irradiating the mark with the light beam from the back of the mark; and detecting means for receiving the light from the mark and detecting, in accordance with the reception, a position of the mark with respect to a predetermined reference position.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic and diagrammatic view of a semiconductor device manufacturing exposure system arranged in accordance with one aspect of the present invention, which includes a plurality of wafer alignment stations and a plurality of exposure apparatuses such as steppers.

FIG. 2 is a plan view showing a semiconductor wafer held by a wafer chuck according to an embodiment of the present invention.

FIG. 3 is a schematic view showing the relation between one wafer alignment station and plural exposure apparatuses, included in the system of FIG. 1.

DESCRIPTION OF THE PREFERRED EMBODIMENTS

Figure 4A:
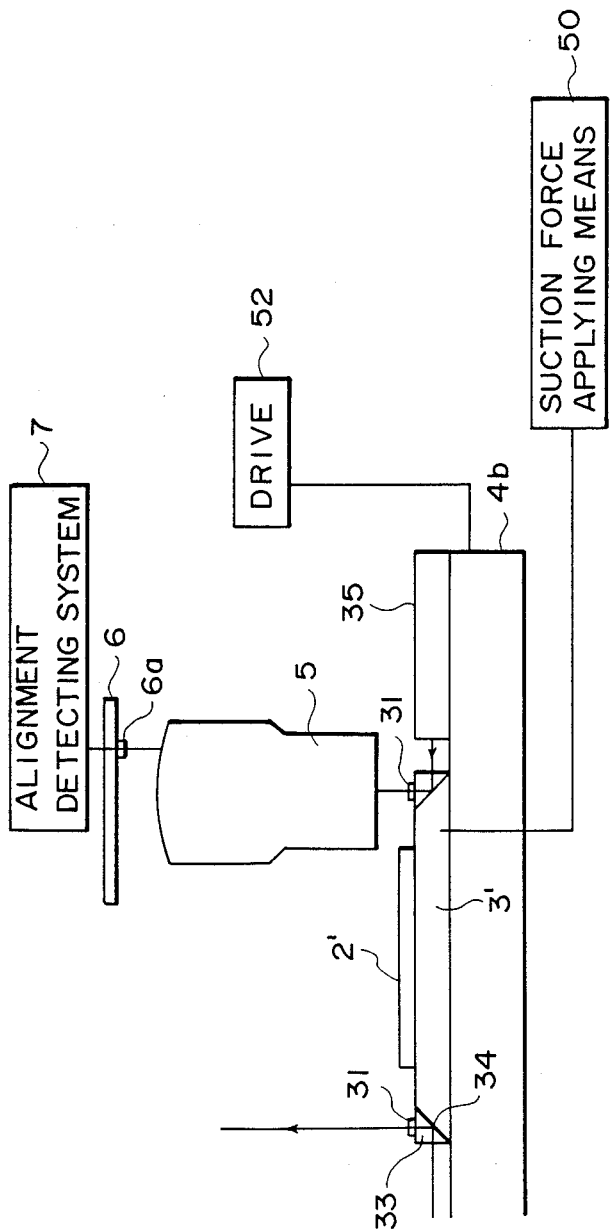
FIG. 4A is a side view schematically and diagrammatically showing a position detecting device included, in accordance with one aspect of the present invention, in one of the steppers of the system of FIG. 1.

Referring first to FIG. 1, there is shown a semiconductor device manufacturing exposure system arranged in accordance with one aspect of the present invention. This system includes a plurality of wafer alignment stations as denoted at numerals 21 and 22 and a plurality of step-and-repeat type reduction projection exposure apparatus (steppers) as denoted at numerals 11-14. In accordance with one of the features of the present invention, each of the wafer alignment stations 21 and 22 is arranged to supply semiconductor wafers 2—2 into each of the steppers 11-14.

The wafer alignment station 21 includes an off-axis alignment detecting system 1 (details of which will be described later), a wafer chuck 3 for carrying and holding thereon one wafer 2 at a time, and a movable wafer stage 4a for supporting the wafer chuck 3. The wafer stage 4a is arranged to be moved by a drive unit, not shown in this Figure, so that the wafer 2 held by the wafer chuck 3 is supplied into one of the steppers 11-14 together with the wafer chuck 2 carrying the same. While not shown in the drawings, the wafer alignment station 21 further includes a laser interferometer unit for measuring or detecting the direction and amount of movement of the wafer stage 4a thereby to detect the "current position" of the wafer stage 4a. The other wafer alignment station 22 has substantially the same structure as of the wafer alignment station 21, so description thereof will be omitted here by assigning the same reference numerals to corresponding elements.

The stepper 11 includes a reduction projection optical system 5 for projecting, in a reduced scale, an image of at least a portion a reticle 6 onto a semiconductor wafer 2' held at this time by a wafer chuck 3' which is supported at this time by a movable wafer stage 4b of the stepper 11. The stepper 11 further includes a TTL alignment detecting optical system 7 (details of which will be described later) and an illumination optical system 8 for emitting light to illuminate the reticle 6 and the wafer 2' so that, at one time, one of different regions (shot areas) of the wafer 2' is exposed to the image of the reticle 6 pattern with the light. Each of the remaining steppers 12-14 has substantially the same structure as of the stepper 11.

The exposure system of FIG. 1 further includes a central processing unit (hereinafter "CPU") 9 which is electrically connected to various components of the wafer alignment stations 21 and 22 and the steppers 11, 12 and 13, such as schematically illustrated in FIG. 1. With this arrangement, various operations of the various components of these portions of the exposure system are effected under the control by the CPU 9. Namely, in accordance with various instruction signals produced at the CPU 9, these portions of the exposure system are operated fully automatically, that is the wafers 2 are automatically fed into the steppers 11-13 and are automatically subjected to respective exposure operations in the steppers 11-13. In other words, each of the wafer alignment stations 21 and 22 and the steppers 11-13 is in an "on-line" relation with the CPU 9.

As compared therewith, the remaining stepper 14 is not in such "on-line" relation with the CPU 9. In place thereof, the exposure system of FIG. 1 is provided with another central processing unit (CPU) 15 electrically connected to the stepper 14 and two input/output devices with external memories 10 and 16, one of which is electrically connected to the CPU 15. With this arrangement, various operations of the stepper 14 is effected under the control by the CPU 15, and transmission/reception of various data to or from the portions of the exposure system which are in the "on-line" relation with the CPU 9 is effected by way of the input/output devices 10 and 16.

FIG. 2 is a plan view showing the wafer chuck 3 of the wafer alignment station 21 when one wafer 2 is held thereon. The wafer chuck 3 has a base member having a surface including a portion on which the wafer 2 is held. As is best seen in FIG. 2, the wafer chuck 3 has two alignment marks 31—31 (hereinafter "chuck marks") which are formed at predetermined positions in a peripheral portion of the surface of the base member, other than the wafer carrying portion thereof Denoted in this Figure by numerals 32—32 are alignment marks (hereinafter "chip marks") formed on the wafer 2 surface in relation to the chips or shot areas and representing the positions of the shot areas. The wafer 2 is attracted to and thus held on the wafer chuck 3 by means of an attraction force which is applied to the wafer 2, by way of the base member of the wafer chuck 3, from a suitable suction force applying means, such as denoted diagrammatically at numeral 50 in FIG. 4A. As for the attraction of the wafer 2, a vacuum-suction force or an electrostatic attracting force may be available. The wafer stage 4a is movable by the driving unit, while supporting the wafer chuck 3. And, the wafer chuck 3 is arranged to maintain the application of attraction force to the wafer 2 when the former is moved by the movement of the wafer stage 4a. This means that the wafer chuck 3 can be moved without displacing the wafer 2 relative to the wafer chuck 3. Where the vacuum-suction force is used, the wafer alignment station is of course arranged to prevent uncoupling of a vacuum supplying tube from the wafer chuck.

In this embodiment, at an unshown wafer loading station, the wafer chuck 3 is mechanically prepositioned by use of an orientation flat formed on a portion of an outer periphery of the wafer chuck 3, such as shown in FIG. 2. On the other hand, one wafer 2 supplied from an unshown wafer supplying station is preparatorily and mechanically prepositioned by use of its orientation flat formed on a portion of an outer periphery thereof, and is placed on the prepositioned wafer chuck 3 at the wafer loading station. Thus, when the wafer 2 is held by the wafer chuck 3, the relative position of the wafer 2 and the wafer chuck 3, i.e. the positional relation between the chip marks 32—32 and the chuck marks 31—31 is roughly or approximately constant, if wafers to be sequentially placed on the wafer chuck 3 have substantially the same chip layout.

The operation of the exposure system of the present embodiment will now be described in more detail, taken in conjunction with FIG. 1 and 2. By way of explanation, description will now be made to actions for supplying a wafer 2 from the wafer alignment station 21 to the stepper 11. At the wafer alignment station 21, the wafer 2 is being held by the wafer chuck 3 in such positional relation that has been described with reference to FIG. 2. At this wafer alignment station 21, exact positions of the shot areas (chips) of the wafer 2 with respect to the chuck marks 31—31 are detected by use of the off-axis alignment detecting system 1. The manner of position detection will now be described in detail.

Data about expected relative positions of the chip marks 32—32 and the chuck marks 31—31, to be established when the wafer 2 is held by the wafer chuck 3 after they are prepositioned, on the basis of their respective orientation flats, and data about the "predetermined distance" between two adjacent shot areas of the wafer 2 have been preparatorily inputted into the CPU 9. By means of an unshown conveying mechanism, the wafer chuck 3 now carrying thereon the wafer 2 is conveyed to the wafer alignment station 21 from the wafer loading station. In the wafer alignment station 21, the wafer chuck 3 is mechanically positioned on the wafer stage 4a. For this mechanical alignment of the wafer chuck 3, the orientation flat thereof is used again. Since the chuck marks 31—31 and the orientation flat of the wafer chuck 3 are formed in a predetermined and exact positional relation, the positions of the chuck marks 31—31 to be established at the time of completion of mechanical alignment of the wafer chuck 3 with respect to the wafer stage 4a can be expected or predicted. Data about the positional relation between the chuck marks 31—31 and the orientation flat of the wafer chuck 3 and data about expected positions of the chuck marks 31—31 to be established at the time of completion of mechanical alignment of the wafer chuck 3 have been preparatorily inputted into the CPU 9. When the mechanical alignment of the wafer chuck 3 is accomplished, the CPU 9 produces instruction signals to move, on the basis of information about the positions of the chuck marks 31—31, the wafer stage 4a by means of the driving unit so that each of the chuck marks 31—31 is caught by the "viewfield" of an optical system of the alignment detecting device 1. By this, the positions of the chuck marks 31—31 are detected. More specifically, the optical system of the alignment detecting device 1 is provided with a reference mark (positional reference) and any positional deviation of the chuck mark 31 from this reference mark is detected. From the thus detected positional deviation and from the amount and direction of movement of the wafer stage 4a, as detected by the laser interferometer unit, the position of the chuck mark 31 is detected. This is also the case with the other chuck mark 31. The principle of detection of mark position by means of the off-axis alignment detecting system 1 is described in detail in U.S. patent application Ser. No. 543,872 filed Oct. 20, 1983 and assigned to the same assignee as of the subject application. So, for the better understanding, reference may be made to this earlier application.

Subsequently, in accordance with the thus detected positional information about the chuck marks 31—31 and the preparatorily stored information about the positions of the shot areas of the wafer 2 (as represented by the positions of the chip marks 32—32) relative to the chuck marks 31—31, the CPU 9 produces instruction signals to intermittently move the wafer stage 4a so that the chip marks 32—32 of the shot areas of the wafer 2 are caught in a predetermined sequence by the optical system of the alignment detecting device 1. That is, the wafer stage 4a is intermittently moved each by the "predetermined distance". By this, the positions of the chip marks 32 and 32 of each shot area (chip) are detected by the alignment detecting device 1 and, whereby, positional deviation of each shot area with respect to its own preset position is detected precisely.

As will be described later, the chuck marks 31—31 are operative as reference marks to be used in aligning the reticle 6 and the wafer 2 in one of the steppers 11-14 (in this respect, the marks 31—31 may have a similar function as of conventional off-axis alignment marks which are formed on the wafer in accordance with the conventional off-axis alignment method). Namely, detecting each of the positions of the shot areas of the wafer relative to the chuck marks 31—31 means that an actual value on the "predetermined distance" to be maintained between two adjacent shot areas of the wafer is detected. So, from the result of detection of the actual positions of the shot areas of the wafer, the deviation from the "predetermined distance" for each shot area (i.e. the error in tee "predetermined distance" for each shot area caused by changes in the environmental conditions of the wafer and the like) is detected. The positional deviations of the shot areas of the wafer, detected in the wafer alignment station 21, are stored into an unshown memory of the CPU 9 or into the input/output devices 10.

Subsequently, the wafer chuck 3 on which the wafer 2 is held is conveyed by an unshown conveying mechanism from the wafer alignment station 21 to the stepper 11. That is, the wafer 2 as well as the wafer chuck 3 holding the same are moved to and placed on the wafer stage 4b of the stepper 11. The positions of the wafer 2 and the wafer chuck 3 when they are placed on the wafer stage 4b are denoted in FIG. 1 by numerals 2' and 3', respectively. Then, the CPU 9 reads out the data stored in its memory and concerning the positional deviations of the shot areas of the wafer 2 detected in the wafer alignment station 21, and supplies such data to the stepper 11. In the stepper 11, the chuck marks 31—31 of the wafer chuck 3 (3') are detected by means of a known type TTL alignment detecting system or a TTL alignment detecting system of the type described later with reference to FIGS. 4A-5. Then, the wafer stage 4b is moved by a driving unit, such as diagrammatically shown at numeral 52 in FIG. 4A, so as to align the chuck marks 31—31 with respect to the reticle 6. By this, alignment of the wafer chuck 3 with respect to the reticle 6 is accomplished. Subsequently, the CPU 9 produces instruction signals to control the driving unit for the wafer stage 4b so as to move intermittently or stepwise the wafer stage 4b to thereby sequentially position the different shot areas of the wafer 2 (2') exactly at an exposure station (pattern transfer station) defined under the projection optical system 5. That is, the movement of the wafer stage 4b for positioning one shot area of the wafer is controlled in the manner that the wafer stage is moved by an amount corresponding to the sum of the "predetermined distance" plus the amount of "positional deviation" of that shot area. By this control, each of the shot areas of the wafer 2 (2') can be sequentially and exactly positioned at the exposure station under the projection optical system 5. As a result, images of the pattern of the reticle 6 can be accurately transferred onto the shot areas of the wafer, respectively.

Where a larger number of wafer chucks such as denoted in FIG. 1 by numerals 3—3 are prepared and one or more wafer alignment stations such as denoted in FIG. 1 by numerals 21, 22 are used, the time required for the alignment operation in an exposure apparatus is substantially equivalent to the time necessary for detecting the chuck marks 31—31 of a wafer chuck, introduced into the exposure apparatus, by use of the "TTL alignment detecting system". This is because the positions of shot areas on each wafer can be preparatorily detected at the wafer alignment station. As a result, a high-speed and high-accuracy alignment and exposure operation is attainable in the exposure apparatus.

It is to be noted that the time necessary for the process of detecting and storing the position of one chip (shot area) to be performed at the wafer alignment station is very shorter than the time necessary for the process of exposing one chip in the stepper. Therefore, there is no possibility that the throughput of the exposure apparatus is reduced by reason of delay of wafer supply from the wafer alignment station. Moreover, the system can be arranged such that wafers are supplied fully automatically from one wafer alignment station to plural steppers.

FIG. 3 shows such system. That is, wafers are supplied from one wafer alignment station to plural steppers. Elements or portions of FIG. 3 arrangement having similar or corresponding functions as of those of the arrangement shown in FIGS. 1 and 2 are denoted by the same reference numerals. In FIG. 3 arrangement, a wafer alignment station 21 is in an "on-line" relation with each of steppers 11, 12 and 13. So, positional information detected at the wafer alignment station 21 in relation to shot areas of each wafer is automatically transmitted to corresponding one of the steppers 11-13 in which the wafer is to be processed. Thus, wafers 2—2 each having been prealigned with the wafer alignment station 21 are supplied fully automatically to the steppers 11-13 and are subjected to the exposure processes in these steppers 11-13 fully automatically. It is of course possible that the positions of shot areas of a wafer are stored into an external memory of input/output devices or the like and the wafer is manually supplied to such a stepper that is not in the "on-line" relation with the wafer alignment station 21. The stepper 14 shown in FIG. 1 or FIG. 3 is such one that is not in the "on-line" relation with the wafer alignment station.

It will be understood that the above-described concept of alignment of different regions of an object is applicable to such an apparatus in which a certain kind of examination is to be performed for each of different regions of an object. An example of such apparatus is a wafer prober.

In the wafer alignment station, light having a wavelength range may be used for the sake of detection of the positions of wafer chips through the offaxis alignment optical system. By doing so, precision of detection of the alignment marks can be improved whereby high-accuracy alignment is attainable.

In order to enhance detection accuracy for each alignment mark, it may be necessary to repeat fetching of a mark signal (i.e. to repeat mark detection) and to obtain an average of mark signals detected in relation to each mark. The repetition of mark detection however leads to prolongation of alignment time. In accordance with the present embodiment, as compared therewith, the process for detecting the positions of shot areas (chips) of each wafer with reference to the wafer chuck marks by use of the off-axis alignment detecting device can be effected simultaneously with the process for exposing another wafer so as to transfer images of the pattern of the reticle onto different regions of the wafer. Therefore, by preparatorily detecting positions of shot areas of each of a number of wafers prior to initiation of the exposure operation, or by providing a plurality of wafer alignment stations for one exposure apparatus, the exposure operation for each wafer can be started immediately after completion of alignment of the wafer chuck marks with the reticle by the TTL alignment detecting system. In other words, there is no possibility that the throughput of the exposure process is reduced by reason of delay of wafer supply due to the prolonged time of the detecting operation at the wafer alignment station. Accordingly, unpreferable degradation of the throughput which will otherwise result from repetition of position detection for the sake of detection accuracy, can be avoided.

This is also the case with the detection rate (percentage of success). That is, the repetition of mark detection for each alignment mark improves the detection rate which results in further improvements in the alignment accuracy.

Figure 4B:
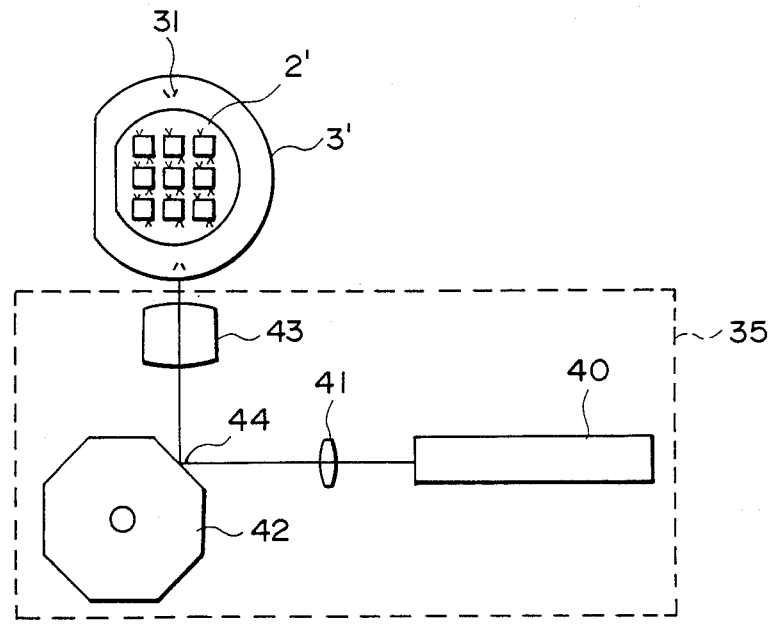
FIG. 4B is a plan view schematically showing a mark scanning system of the position detecting device of FIG. 4A.
Figure 4C:
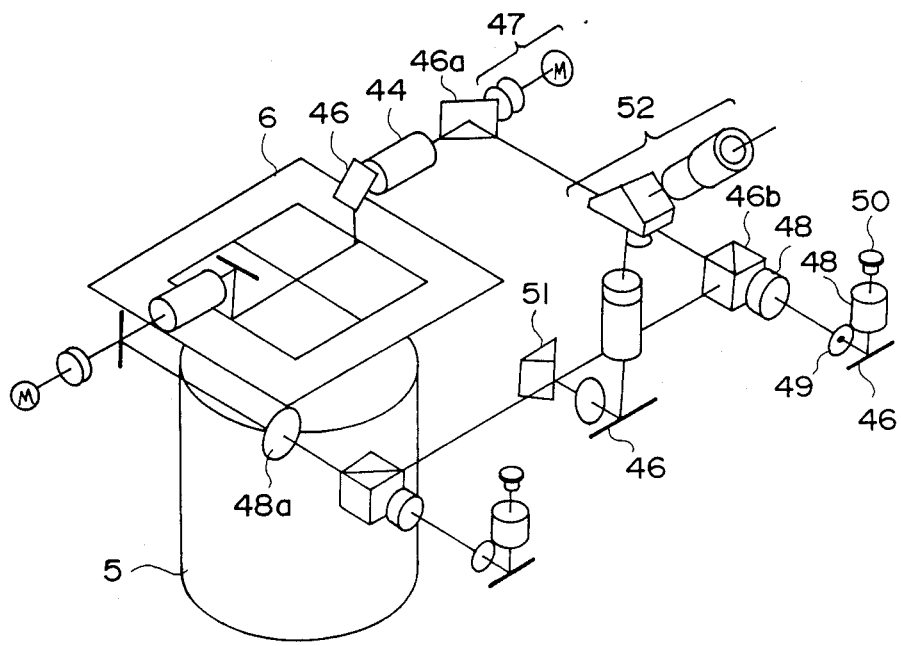
FIG. 4C is a perspective view schematically showing a mark detecting optical system of the position detecting device of FIG. 4A.

Referring now to FIGS. 4A–4C, description will now be made to details of the position detecting device used in each of the steppers of the exposure system of FIG. 1, for the sake of alignment of the wafer chuck with the reticle 6.

As shown in FIG. 4A, the wafer chuck 3' has a transparent member 33 provided on its outer peripheral portion. The chuck marks 31—31 of the wafer chuck 3' are provided on the transparent member 33. Formed at the interface between the transparent member 33 and the base of the wafer chuck 3' is a mirror 34. Mounted on the wafer stage 4b is a scanning optical system 35 including a light source for producing a light beam with which one of the chuck marks 31—31 is to be scanned. While in FIG. 4A only one scanning optical system is illustrated, the device actually includes another scanning optical system for scanning another chuck mark 31 with a light beam.

As shown in FIG. 4A, the scanning optical system 35 emits a light beam horizontally, as viewed in this Figure, toward the wafer chuck 3'. This scanning beam emitted from the scanning optical system 35 is incident on the transparent member 33 of the wafer chuck 3' and is reflected by the mirror 34 upwardly as viewed in this Figure. Since the chuck marks 31—31 are formed on the upper surface of the transparent member 33 such as shown in FIG. 4A, the light beam reflected by the mirror 34 illuminates one of the chuck marks 31 from the back thereof. That is, the scanning beam is incident on the back of the chuck mark 31.

FIG. 4B shows details of the scanning optical system 35. Denoted in this Figure by numeral 40 is a laser source; by 41, a condenser lens; by 42, a polygonal mirror; and by 43, an objective lens. The objective lens 43 has a telecentric arrangement having a center of pupil disposed substantially at a point of reflection 44 of the polygonal mirror 43, used for the sake of scanning deflection. The center of pupile is the focal point of the objective lens. Therefore, the chief ray of the light passed through the objective lens 43 becomes parallel to the optical axis of the objective lens 43, so that, after reflection by the mirror 34, it is incident on and in the neighborhood of the chuck mark 31 perpendicularly. Thus, with the rotation of the polygonal mirror 42, the chuck mark 31 and a portion in the neighborhood thereof are scanned by the light parallel to the optical axis of the objective lens 43.

The scanning beam now containing a mark signal component corresponding to the chuck mark 31 is directed to one of alignment marks 6a of the reticle 6 by way of the projection optical system 5 which is telecentric both on the object side and on the image side. The reticle alignment mark 6a and the portion of the reticle 6 in the neighborhood of the mark 6a are scanned by the scanning laser beam, and the scanning beam after passing through the reticle 6 is incident on the TTL alignment detecting optical system 7. Details of the TTL alignment detecting optical system 7 are shown in FIG. 4C. It will be seen from this Figure that the alignment detecting optical system 7 includes two detecting portions for detecting the two chuck marks 31—31, respectively. Since these portions have essentially the same structure, description will now be made only to one of these portions. Denoted in FIG. 4C by numeral 44 is an objective lens; by 46a and 46b, half mirrors; by 46, a mirror; by 47, an illumination system provided to allow observation; by 48, a condensing lens; by 48a, a relay lens; by 49, a spatial filter; by 50, a photodetector; by 51, a prism; and by 52, an observation optical system. The scanning beam passed through the reticle 6 is reflected by the mirror 46 to the objective lens 44. The light emerging from the objective lens 44 is incident on the half mirror 46a by which a portion of the light is reflected to the half mirror 46b. The light passing through the half mirror 46b is incident on the condenser lens 48. The spatial filter 49 is provided at a position at which an image of the pupil of the objective lens 43, substantially coincident with the point of reflection 44 of the polygonal mirror 42, is formed by the condenser lens 48. The spatial filter 49 is arranged to transmit only such component of the light that has been scatteringly diffracted by the chuck mark 31 and the reticle alignment mark 6a and to intercept the other component. The light passed through the spatial filter 49 is concentrated by the additional condenser lens 48 on the surface of the photodetector 50. Thus, the scatteringly diffracted light is detected by this photodetector 50, which means that the photodetector 50 produces an output only when the scanning laser beam is incident on an edge of the mark. On the basis of output signals from the photodetector 50, representing the positions of the chuck mark 31 and the reticle alignment mark 6a, positional deviation therebetween is detected. In this embodiment, the illumination system 47 and the observation optical system 52 are provided separately from the photodetecting system, so as to allow an operator to directly observe the deviation of the chuck mark 31 and the reticle alignment mark 6a. The illumination system 47 and the observation optical system 52 are of the type such as disclosed in Japanese Laid-Open Patent Application, Laid-Open No. 54056/1979.

As described, the position detecting beam passes through the projection optical system and the reticle each once. This is a striking distinction from the conventional TTL alignment detecting optical system in which the position detecting beam passes through the projection lens and the reticle each twice. Therefore, significantly high-level output signals are obtainable as compared with those detectable with the use of the conventional TTL alignment detecting optical system. Further, in this embodiment, the position detecting beam incident on the reticle alignment mark 6a and passed through the reticle 6 is directly received by the TTL alignment optical system 7. This assures detection of reticle mark signals which are stable and "clear" and less contain noise components, as compared with optical signals detectable from the image of the reticle mark as projected on the wafer. This avoids necessity of separation or extraction of the optical signal component directly reflected by the reticle alignment mark. Therefore, use of additional optical components such as a polarizing plate is no more necessary. So, the optical arrangement can be made compact. Further, according to the present embodiment, it is not necessary to irradiate the wafer with light at the time of position detection. This allows use of an illumination light beam having the same wavelength as of the light used for the exposure.

Figure 5:
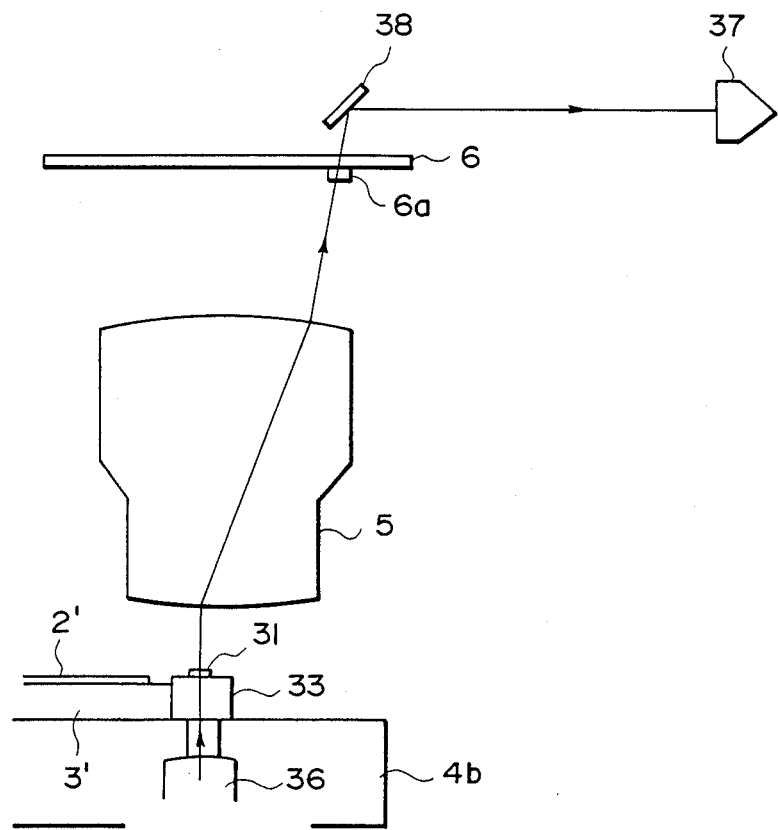
FIG. 5 is a side view schematically showing another embodiment of the position detecting device according to the present invention.

FIG. 5 shows another embodiment of the position detecting device. Elements of the present embodiment as having similar or corresponding functions as of those of the foregoing embodiments are denoted by the same reference numerals. In FIG. 5, the device includes an illumination optical system 36 and an image pickup device 37. The illumination optical system 36 is provided at a position exactly under the transparent member 33 of the wafer chuck 3' when it is positioned on the wafer stage 4b. With this arrangement, the chuck mark 31 is directly irradiated, from its back, with the light emitted from the illumination optical system 36. That is, the mirror 34 of the FIG. 4A embodiment is omitted in the present embodiment. Of course, the FIG. 4A embodiment may be modified such as shown in FIG. 5 and, on the other hand, the FIG. 5 embodiment may be modified such as shown in FIG. 4A. In the FIG. 5 embodiment, the light emitted from the illumination optical system 36 illuminates the chuck mark 31 and the reticle mark 6a by way of the projection optical system 5, such that an image of the chuck mark 31 and an image of the reticle mark 6a are formed on an image pickup surface of the image pickup device 37 with an aid of a mirror 38. The present embodiment is advantageous in the point that the deviation between the chuck 3' and the reticle 6' can be observed actually.

As to the formation of the chuck marks, the height of the chuck mark can be made the same as that of the wafer surface, provided that the light used for the position detection and the light used for the exposure have the same wavelength. If they have different wavelengths, the chuck mark is formed at a position which is shifted in the direction of the optical axis by an amount corresponding to the correction of chromatic aberration of the projection optical system 5. The scanning optical system 35 or the illumination optical system 36 may be provided for each of the chuck marks 31—31, or alternatively it may be provided for plural chuck marks. In the latter case, it is necessary that the scanning optical system or the illumination optical system is disposed such that each of the chuck marks, when it is placed under the projection optical system, is illuminated by the light from the scanning optical system or the illumination optical system.

While, in the foregoing, the invention has been described with reference to embodiments using steppers, the concept of the present invention is of course applicable to alignment in mirror scan type exposure apparatuses, contact type exposure apparatuses having no projection optical system, X-ray exposure apparatuses. With the concept of the present invention, in any case, "clear" mark signals are stably detectable.

While the invention has been described with reference to the structures disclosed herein, it is not confined to the details set forth and this application is intended to cover such modifications or changes as many come within the purposes of the improvements or the scope of the following claims.

What is claimed is:

1. A method of sequentially positioning different regions of a semiconductor wafer, onto each of which regions an image is to be transferred at a transfer station, said method comprising the steps of:

detecting, at a non-transfer station, positions of the different regions of the wafer with respect to a reference mark;

detecting, at the transfer station, a position of the reference mark with respect to a standard mark;

detecting positions of the different regions of the wafer with respect to the standard mark on the basis of the detection of the position of the reference mark with respect to the standard mark and the detection of the positions of the different regions of the wafer with respect to the reference mark; and moving the wafer so as to sequentially place the different regions thereof at the transfer station while controlling the movement of the wafer, for the sequential placing, in accordance with the detection of the positions of the different regions of the wafer with respect to the standard mark, whereby the different regions of the wafer are sequentially and accurately positioned with respect to the standard mark.

2. A method of positioning in sequence different portions of a semiconductor wafer with respect to an image transfer station at which an image is to be transferred onto the wafer, said method comprising the steps of:

placing the wafer in a predetermined region on a wafer holder;

holding the wafer immovable with respect to the wafer holder upon which the wafer is placed;

detecting, at a non-transfer station other than said transfer station, the positions of the different portions of the wafer with respect to a reference mark by use of alignment marks provided on the wafer in relation to the different portions of the wafer, wherein said reference mark is formed in a region of the wafer holder other than said predetermined region;

detecting, at the transfer station, the position of said reference mark with respect to a standard mark which is in a predetermined positional relation with the transfer station;

detecting the positions of the different portions of the wafer with respect to said standard mark on the basis of (i) the positions of the different portions with respect to said reference mark and (ii) the position of said reference mark with respect to said standard mark; and controlling the movement of the wafer holder at the time of the sequential positioning of the different portions of the wafer at the transfer station, on the basis of the detection of the positions of the different portions with respect to said standard mark.

3. A method according to claim 2, wherein the image is transferred onto each of the different portions of the wafer by use of an imaging optical system, wherein the positions of the different portions of the wafer with respect to said reference mark are detected without use of the imaging optical system, and wherein the position of said reference mark with respect to said standard mark is detected by use of the imaging optical system.

4. A method according to claim 2, wherein said reference mark is formed in a light-transmitting portion of the wafer holder which is outside said predetermined region and wherein the position of said reference mark with respect to said standard mark is detected by (i) irradiating said reference mark and said standard mark with a light emitted from a light source and passed through the light-transmitting portion of the wafer holder and (ii) photoelectrically detecting the light from said reference mark and said standard mark by use of a photoelectric detector.

5. An apparatus for positioning in sequence different portions of a semiconductor wafer with respect to an image transfer station at which an image is transferred onto the wafer, said apparatus comprising:

a movable wafer holder operable to hold the wafer;

first detecting means for detecting, at a non-transfer station other than the transfer station, the positions of the different portions of the wafer, held by said wafer holder, with respect to a reference mark provided on said wafer holder by use of alignment marks provided on the wafer in relation to the different portions thereof;

second detecting means for detecting, at the transfer station, the position of said reference mark with respect to a standard mark which is in a predetermined positional relation with the transfer station; and control means operable to detect the positions of the difference portions of the wafer held by said wafer holder with respect to said standard mark on the basis of (i) the positions of the different portions with respect to said reference mark detected by said first detecting means and (ii) the position of said reference mark with respect to said standard mark detected by said second detecting means, said control means further being operable to control the movement of said wafer holder at the time of the sequential positioning of the different portions of the wafer at the transfer station, on the basis of the detection of the positions of the different portions of the wafer with respect to said standard mark.

6. An apparatus according to claim 5, further comprising an imaging optical system for forming an image on the wafer at the transfer station, wherein said first detecting means is operable to detect the positions of the different portions of the wafer with with respect to said reference mark without use of said imaging optical system and wherein said second detecting means is operable to detect the position of said reference mark with respect of said standard mark by use of said imaging optical system.

7. An apparatus according to claim 5, wherein said wafer holder has a light-transmitting portion in which said reference mark is formed and wherein said second detecting means includes (i) a light source for emitting a light which is directed through said light-transmitting portion to illuminate said reference mark and said standard mark and (ii) a photoelectric detector for photoelectrically detecting the light from said reference mark and said standard mark.

8. A device for sequentially positioning different regions of a wafer at a predetermined station, said device comprising:

a movable wafer chuck having a mark;

a wafer stage for moving said wafer chuck;

detecting means for detecting a positional relationship between the mark of said wafer chuck and a mark provided on the wafer held by said wafer chuck; and control means for controlling the movement of said wafer chuck by said wafer stage, on the basis of the detection by said detecting means, to sequentially position the regions of the wafer at the station.

9. A device for sequentially positioning different regions of a wafer at a predetermined station, said device comprising:

a movable wafer chuck having a mark;

a wafer stage for moving said wafer chuck;

detecting means for detecting a positional relationship of each of the regions of the wafer held by said wafer chuck, with respect to the mark of said wafer chuck; and control means for controlling the movement of said wafer chuck by said wafer stage, on the basis of the detection by said detecting means, to sequentially position the regions of the wafer at the station.

10. A method of sequentially positioning different regions of a wafer at a predetermined station, said method comprising the steps of:

holding the wafer on a movable wafer chuck having a mark;

detecting a positional relationship of each of the regions of the wafer with respect to the mark of the wafer chuck by use of an alignment optical system; and moving the wafer chuck by a wafer stage and controlling the movement of the wafer chuck on the basis of the detection to sequentially position the regions of the wafer at the station.

* * * * *

UNITED STATES PATENT AND TRADEMARK OFFICE
CERTIFICATE OF CORRECTION

PATENT NO. : 4,861,162
DATED : August 29, 1989
INVENTOR(S) : HIDEKI INA

Page 1 of 3

It is certified that error appears in the above-identified patent and that said Letters Patent is hereby corrected as shown below:

AFTER [76] INVENTOR AND BEFORE [21] APPL. NO.

Insert --[73] Assignee: Canon Kabushiki Kaisha, Tokyo, Japan--.

IN [57] ABSTRACT

Line 13, "water" should read --wafer--.

COLUMN 1

Line 34, "apa-" should read --apparatus,--.
    Line 35, "pratus," should be deleted.
    Line 57, "constant" should read --constant.--.
    Line 60, "positiong" should read --positioning--.

COLUMN 2

Line 32, "marks" should read --mark--.

COLUMN 3

Line 33, "respect of" should read --respect to the standard mark on the basis of the detection of--.

COLUMN 4

Line 62, "wafer chuck 2" should read --wafer chuck 3--.

UNITED STATES PATENT AND TRADEMARK OFFICE
CERTIFICATE OF CORRECTION

PATENT NO. : 4,861,162
DATED : August 29, 1989
INVENTOR(S) : HIDEKI INA

It is certified that error appears in the above-identified patent and that said Letters Patent is hereby corrected as shown below:

COLUMN 5

Line 6, "portion" should read --portion of--.
    Line 41, "is" should read --are--.
    Line 55, "thereof" should read --thereof.--.

COLUMN 7

Line 49, "tee" should read --the--.

COLUMN 8

Line 43, "very" should read --much--.

COLUMN 9

Line 14, "offaxis" should read --off-axis--.

COLUMN 10

Line 19, "polygonal mirror 43," should read --polygonal mirror 42,--.
    Line 20, "pupile" should read --the pupil--.

COLUMN 12

Line 30, "many" should read --may--.
    Line 63, "placing" should read --¶ placing--.

UNITED STATES PATENT AND TRADEMARK OFFICE
CERTIFICATE OF CORRECTION

PATENT NO. : 4,861,162
DATED : August 29, 1989
INVENTOR(S) : HIDEKI INA

It is certified that error appears in the above-identified patent and that said Letters Patent is hereby corrected as shown below:

COLUMN 13

Line 59, "difference" should read --different--.

COLUMN 14

Line 11, "with with" should read --with--.

Signed and Sealed this

First Day of October, 1991

Attest:

HARRY F. MANBECK, JR.

Attesting Officer

Commissioner of Patents and Trademarks